United States Patent [19]

Hanawa

[11] Patent Number: 4,767,993

[45] Date of Patent: Aug. 30, 1988

[54] COIL SYSTEM FOR MAGNETIC RESONANCE IMAGING

[75] Inventor: Masatoshi Hanawa, Ootawara, Japan

[73] Assignee: Kabushiki Kaisha Toshiba, Kawasaki, Japan

[21] Appl. No.: 75,758

[22] Filed: Jul. 20, 1987

[30] Foreign Application Priority Data

Jul. 24, 1986 [JP] Japan .................... 61-172744

[51] Int. Cl.$^4$ .................... G01R 33/20
[52] U.S. Cl. .................... 324/318; 324/322
[58] Field of Search .................... 324/307, 318, 322, 311

[56] References Cited

U.S. PATENT DOCUMENTS

| | | | |
|---|---|---|---|
| 3,427,532 | 2/1969 | Nelson | 324/322 |
| 3,771,055 | 11/1973 | Anderson | 324/322 |
| 4,449,097 | 5/1984 | Young et al. | 324/318 |
| 4,665,368 | 5/1987 | Sugiyama et al. | 324/318 |

*Primary Examiner*—Stewart J. Levy
*Assistant Examiner*—Kevin D. O'Shea
*Attorney, Agent, or Firm*—Foley & Lardner, Schwartz, Jeffery, Schwaab, Mack, Blumenthal & Evans

[57] ABSTRACT

A coil system for magnetic resonance imaging in a magnetic resonance imaging system, used to transmit the excitation pulse and to receive the magnetic resonance signals, includes a first coil for transmitting a predetermined high-frequency pulse, second and third coils, arranged on a propagation path of the magnetic resonance signal at a position closer to the object to be examined than the first coil in directions orthogonal to each other, for receiving the magnetic resonance signals, and a pair of tuning elements, respectively provided in association with the second and third coils, for tuning the second and third coils to predetermined magnetic resonance signals. The tuning elements tune the second and third coils slightly offset from accurate tuning points so that voltage phases of the magnetic resonance signals received through the second and third coils coincide with each other.

11 Claims, 2 Drawing Sheets

COIL SYSTEM FOR MAGNETIC RESONANCE IMAGING

BACKGROUND OF THE INVENTION

The present invention relates to a coil system for magnetic resonance (MR) imaging, which is incorporated in a magnetic resonance imaging system for imaging information based on a density distribution of specific nuclear spins and/or a relaxation time of resonance at a specific portion of an object to be examined, and which is used to transmit an excitation pulse for exciting magnetic resonance and to receive a magnetic resonance signal generated by the magnetic resonance.

A uniform static magnetic field is applied to a predetermined portion to be imaged, i.e., a portion including a specific slice to be imaged of an object to be examined, a predetermined gradient magnetic field is applied to superpose the static magnetic field, and a predetermined selective excitation pulse, i.e., an RF (radio frequency) magnetic field (electromagnetic wave signal) for excitation is applied in a direction perpendicular to a direction of the static magnetic field, thereby generating an MR phenomenon only at the slice portion. In addition, after the excitation pulse is released, a magnetic resonance signal generated from the nuclear spin is received and Fourier-transformed, so that a spectrum of an angular frequency of a specific nuclear spin is obtained. A tomographic image based on the MR information, i.e., an MR image, can be obtained by image reconstruction based on a computed tomography (CT) technique. For example, according to a back projection technique, a slice to be imaged is excited to generate the MR phenomenon, and then a linear gradient magnetic field having an inclination with respect to an X' direction (a coordinate system rotated from an X-axis through $\theta°$) is superposed on the static magnetic field, thereby obtaining an FID (free induction decay) signal. The FID signal is Fourier-transformed to obtain projection information. When projection information in each direction in an X-Y plane is obtained by rotating the X'-axis at the slice portion on the X-Y plane, the MR image can be reconstructed on the basis of this information.

In the MR imaging system for visualizing the MR image of an object to be examined in accordance with the above principle, a coil system comprising an RF coil is provided to transmit the excitation pulse as the RF electromagnetic wave signal to the object to excite the MR of nuclear spin or to receive the MR signal as the RF electromagnetic wave signal emitted from the nuclear spin by the MR. The RF coil is provided such that an RF magnetic field to be transmitted or received is positioned perpendicular to a main magnetic field. In a conventional system, the RF coil is constituted by a pair of saddle coils opposing each other across an imaging area where the object is placed.

An arrangement of a coil system in the conventional MR imaging system will be described below with reference to FIG. 1. Main magnetic field coil 1 serves as a magnet and generates static magnetic field B0 as a main magnetic field in a Z direction of FIG. 1 (normally in a direction coincident with a body axis direction of object P). Gradient magnetic field coil 2 generates slice-selecting (normally in the Z direction) and phaseencoding and/or reading (normally in an X and/or Y direction) gradient magnetic fields. RF coil 3 consists of a pair of saddle coils and is used to both transmit and receive the RF signal.

However, in the conventional system shown in FIG. 1, since coil 3 is constituted by the pair of coils opposing each other in a specific direction, only a component in a specific direction of the resonance magnetic field is received, thereby decreasing the reception efficiency of the MR signal. When the reception efficiency is low, an S/N ratio cannot be increased, and an image quality of the MR image is adversely affected and degraded by noise.

SUMMARY OF THE INVENTION

It is an object of the present invention to provide a coil system for an MR imaging system which can increase reception efficiency of an MR signal to obtain a good MR image.

A coil system for MR imaging according to the present invention includes a first coil for transmitting an excitation pulse, second and third coils, arranged on a propagation path of the MR signal at a position closer to an object to be examined than the first coil is in directions orthogonal to each other, for receiving the MR signal, and a pair of tuning elements, provided in association with the second and third coils, respectively, for tuning the second and third coils to predetermined MR signals. The tuning elements tune the second and third coils slightly offset from accurate tuning points, respectively, so that voltage phases of the MR signals received through the second and third coils coincide with each other.

In the coil system for MR imaging of the present invention, when an excitation pulse is transmitted from the first coil to the object and an MR signal is emitted from the object, high-frequency voltages caused by the MR are induced in the second and third coils, respectively, and high-frequency currents flow. Since the second and third coils are arranged orthogonally to each other, phases of the high-frequency voltages induced therein are shifted by 90° from each other. However, according to the present invention, since the tuning elements are provided to the second and third coils so that tuning points are offset to cancel the 90° phase shift, the voltage phases to be tuned and received are corrected. As a result, no shift occurs in the voltage phases of the MR signal. For this reason, the high-frequency voltages respectively flowing through the second and third coils are synthesized with each other upon phase matching, and then fetched in a processor of the MR imaging system. As a result, effective reception intensity of the MR signal is improved, and an S/N ratio of a receiving system is improved, so that a good MR image less adversely affected by the noise can be obtained. Note that in the system of the present invention, reception sensitivity is slightly decreased as compared to the case wherein signals are received at accurate tuning points. However, if the tuning points are offset, a noise component is decreased as the signal intensity is decreased, so that the S/N ratio does not change. Therefore, the effect of improving the S/N ratio, obtained by synthesizing signals upon phase matching, is far more significant.

According to the coil system for MR imaging of the present invention, the reception efficiency and the S/N ratio of the MR signal can be increased, and a good MR image can be obtained.

DETAILED DESCRIPTION OF THE PREFERRED EMBODIMENTS

Figure 2:
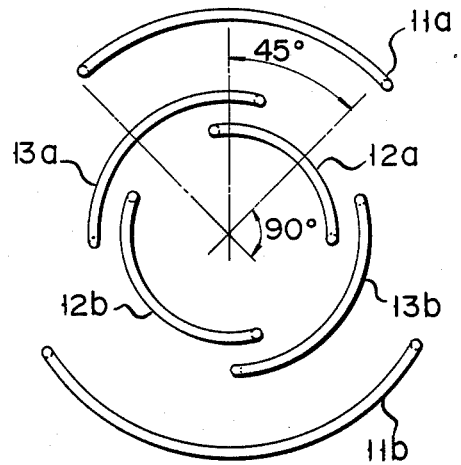
FIG. 2 is a schematic view showing an arrangement of coils in a coil system for MR imaging according to a first embodiment of the present invention.
Figure 3:
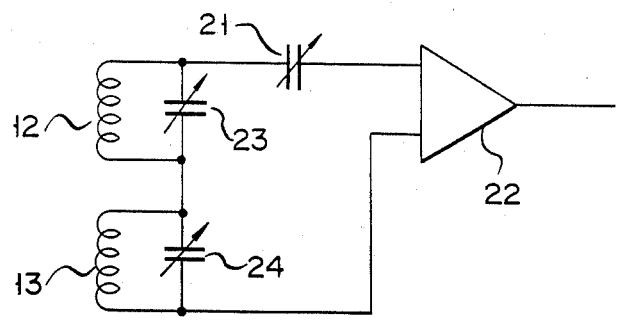
FIG. 3 is a circuit diagram schematically showing an arrangement of a receiving system of the embodiment shown in FIG. 1.

FIG. 2 shows a coil arrangement in a coil system for MR imaging according to the first embodiment of the present invention, and FIG. 3 shows a circuit of a receiving system of the same system.

As shown in FIG. 2, the coil system includes a pair of first coils 11a and 11b for transmitting an excitation pulse, and pairs of second and third coils 12a and 12b and 13a and 13b for receiving an MR signal.

Figure 1:
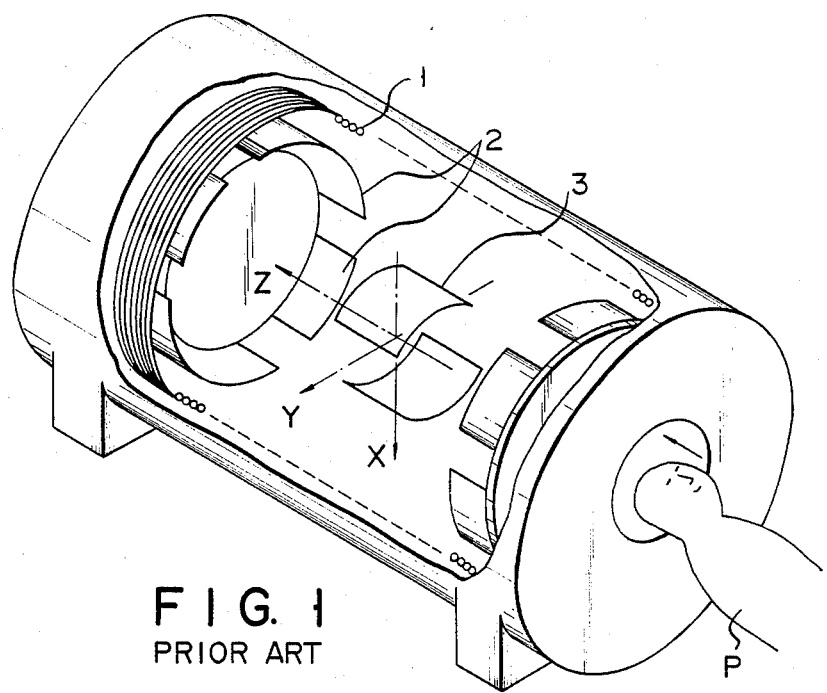
FIG. 1 is a schematic perspective view for explaining an arrangement of coils in a conventional MR imaging system.

Similar to coil 3 shown in FIG. 1, first coils 11a and 11b are a pair of saddle coils opposing each other across a imaging area where an object to be examined is arranged. Second and third coils 12a and 12b, and 13a and 13b are arranged on a propagation path of an MR signal generated from the object at positions closer to a resonance portion than first coils 11a and 11b are, i.e., inside first coils 11a and 11b. Similar to first coils 11a and 11b, second and third coils 12a, 12b and 13a, 13b are respectively pairs of saddle coils opposing each other across an imaging area where the object is arranged. As shown in FIG. 2, second and third coils 12a and 12b and 13a and 13b are arranged in directions orthogonal to each other. Second and third coils 12a and 12b, and 13a and 13b are arranged to be offset from first coils 11a and 11b by 45° (+45° and −45°, respectively). For this reason, magnetic coupling between first coils 11a and 11b and second coils 12a and 12b equals to that between first coils 11a and 11b and third coils 13a and 13b. The pairs of first, second, and third coils 11a and 11b, 12a and 12b, and 13a and 13b are connected in series, respectively.

An arrangement of a receiving system including second and third coils 12 (series-connected second coils 12a and 12b are denoted by single reference numeral 12) and 13 (series-connected third coils 13a and 13b are denoted by single reference numeral 13) will be described below with reference to FIG. 3.

One end of second coil 12 is connected to one input terminal of preamplifier 22 through first capacitor 21. The other end of second coil 12 is connected to one end of third coil 13. The other end of third coil 13 is connected to the other input terminal of preamplifier 22. Second capacitor 23 is connected in parallel with second coil 12, and third variable capacitor 24 is connected in parallel with third coil 13. Note that first, second, and third capacitors 21, 23, and 24 are all variable capacitors which can adjust static capacitance.

In the above arrangement, when a pulse-like magnetic field gradient and an excitation pulse are applied to an object to be examined in a static magnetic field in accordance with a predetermined pulse sequence to generate an MR phenomenon only at a specific slice portion of the object, an MR signal is generated at the slice portion. RF voltages are induced in second and third coils 12 and 13 by this MR signal. RF voltages induced in second and third coils 12 and 13 are supposed to have phases shifted from each other by 90°. Currents I2 and I3 flowing through second and third coils 12 and 13 caused by RF voltage e are represented by following equations (1) and (2):

$$I2 = e/\{r2 + j(\omega L2 - 1/\omega C2)\} \quad (1)$$

$$I3 = e \cdot \exp(\pi j/2)/\{r3 + j(\omega L3 - 1/\omega C3)\} \quad (2)$$

where L2 and r2 are an inductance and a high-frequency resistance, respectively, of second coil 12, L3 and r3 are those of third coil 13, and C2 and C3 are capacitances of second and third capacitors 23 and 24 for tuning, respectively. Relations of L2=L3 and r2=r3 are established between second and third coils 12 and 13.

Voltages e2 and e3 respectively appearing across second and third capacitors 23 and 24 are represented by the following equations:

$$e2 = e/j\omega C2 \cdot \{r2 + j(\omega L2 - 1/\omega C2)\}$$

$$e3 = e \cdot \exp(j\pi/2)/j\omega C3 \cdot \{r3 + j(\omega L3 - 1/\omega C3)\}$$

For this reason, if values of C2 and C3 are determined to establish the following relationship, phases of voltages e2 and e3 can be set equal to each other:

$$\tan^{-1}\{(-\omega L2 + 1/\omega C2)/r2\} = \pi/2 + \tan^{-1}\{(-\omega L3 + 1/\omega C3)/r3\}$$

If the phases of voltages e2 and e3 are equal, signals of e2 and e3 are synthesized with matched phases, and then input to amplifier 22. Therefore, an S/N ratio of the MR signal obtained through preamplifier 22 is significantly improved, and a maximum S/N ratio that $\sqrt{2}$ times that obtained by the conventional system can be obtained. An MR image reconstructed on the basis of an output from preamplifier 22 is less adversely affected by noise and hence is a high-quality image.

Note that first capacitor 21 is an impedancematching capacitor for obtaining matching with respect to an input impedance of preamplifier 22. Signal processing including image reconstruction for obtaining the MR image from the MR signal is the same as that in the conventional system.

As described above, the coil system according to the present invention includes first coils 11a and 11b for transmitting an excitation pulse, second and third coils 12 and 13, provided in directions orthogonal to each other, for receiving the MR signals, and capacitors 23 and 24 for substantially tuning second and third coils 12 and 13 to the MR signals and at the same time for causing the voltage phases of the received signals of second and third coils 12 and 13 to coincide with each other. Therefore, without a phase shifter and a signal synthesizer consisting of special circuits, the voltage phases of two pairs of coils 12 and 13, shifted from each other by 90°, can be set to coincide with each other. Thus, the S/N ratio of the MR signal can be improved and the MR image with high quality can be obtained.

A description has been made with reference to the coil system according to the first embodiment of the present invention. However, it is a matter of course that the present invention is not limited to the first embodiment but can be variously modified and carried out.

For example, each of the two pairs of coils for receiving the MR signals may be replaced with a pair of saddle coils, e.g., a pair of elliptic coils provided orthogonally to each other may be used.

A second embodiment of the present invention which uses elliptic coils will be described below with reference to FIG. 4.

Figure 4:
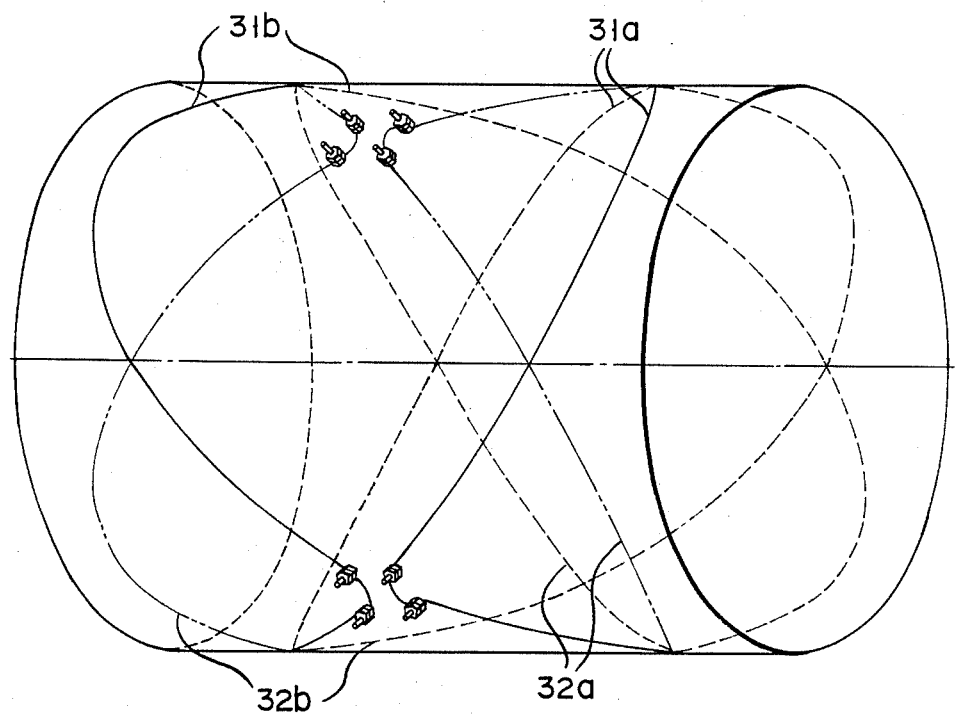
FIG. 4 is a schematic perspective view showing an arrangement of receiving coils in a coil system for MR imaging according to a second embodiment of the present invention.

As shown in FIG. 4, a first pair of receiving coils are constituted by elliptic coils 31a and 31b orthogonal to each other, and a second pair of receiving coils are constituted by elliptic coils 32a and 32b orthogonal to each other. The first and second pairs of coils 31a and 31b and 32a and 32b are provided in directions orthogonal to each other. The first and second pairs of coils 31a and 31b and 32a and 32b function substantially equivalently to second and third coils 12a and 12b and 13a and 13b shown in FIG. 2, respectively, and are connected in series with each other as shown in FIG. 4. Since first and second pairs of coils 31a and 31b and 32a and 32b are substantially equivalent to second and third coils 12a and 12b and 13a and 13b in the first embodiment, a receiving system may be arranged in substantially the same manner as that shown in FIG. 3.

In addition, in FIG. 3, variable capacitors are used as first to third capacitors 21, 23, and 24 so that resetting can be performed even when changes occur in impedance and/or tuning conditions due to changes in system installation conditions or a state of an object to be examined. However, if such changing factors are sufficiently few, fixed capacitors may be used as these capacitors. Furthermore, in order to adjust and set the tuning conditions, an auxiliary inductor and/or an auxiliary capacitor may be added in the tuning circuit for adjustment and resetting instead of changing main capacitors, and these auxiliary inductor and/or auxiliary capacitor may be variably adjusted.

What is claimed is:

1. A coil system for magnetic resonance imaging in a magnetic resonance imaging system for applying a predetermined excitation pulse to an object to be examined arranged in a predetermined magnetic field to generate a magnetic resonance phenomenon, and for detecting and acquiring magnetic resonance signals generated by the magnetic resonance phenomenon to reconstruct a magnetic resonance image of the object, said coil system transmitting the excitation pulse and receiving the magnetic resonance signals, and comprising:
   first coil means for transmitting the predetermined excitation pulse;
   second and third coil means, arranged on a propagation path of the magnetic resonance signal at a position closer to the object than said first coil means in directions orthogonal to each other, for receiving the magnetic resonance signals; and
   a pair of tuning means, respectively provided in association with said second and third coil means, for tuning said second and third coil means slightly offset from accurate tuning points so that voltage phases of the magnetic resonance signals received through said second and third coil means coincide with each other.

2. A system according to claim 1, wherein said tuning means include means for tuning with respect to a signal supposed to be induced in one of said second and third coil means in a phase advanced by substantially 45° and tuning with respect to a signal supposed to be induced in the other in a phase delayed by substantially 45°.

3. A system according to claim 1, wherein said tuning means include capacitors respectively connected in parallel with said second and third coil means.

4. A system according to claim 1, wherein said tuning means include variable capacitors respectively connected to said second and third coil means.

5. A system according to claim 1, wherein said tuning means include inductors respectively connected in series with said second and third coil means.

6. A system according to claim 1, wherein said tuning means include variable inductors respectively connected in series with said second and third coil means.

7. A system according to claim 1, wherein said second and third coil means are respectively offset from said first coil through 45° in opposite directions.

8. A system according to claim 1, wherein each of said second and third coil means includes a pair of saddle coils.

9. A system according to claim 1, wherein each of said second and third coil means includes a pair of elliptic coils.

10. A system according to claim 1, wherein said first coil means includes a pair of saddle coils.

11. A coil system for magnetic resonance imaging in a magnetic resonance imaging system for applying a predetermined excitation pulse to an object to be examined arranged in a predetermined magnetic field to generate a magnetic resonance phenomenon, and for detecting and acquiring magnetic resonance signals generated by the magnetic resonance phenomenon to reconstruct a magnetic resonance image of the object, said coil system transmitting the excitation pulse and receiving the magnetic resonance signals, and comprising: first coil means for transmitting the predetermined excitation pulse; second and third coil means, arranged on a propagation path of the magnetic resonance signal at a position closer to the object than said first coil means in directions orthogonal to each other, for receiving the magnetic resonance signals; and a pair of tuning means, respectively provided in association with said second and third coil means, for tuning said second and third coil means to predetermined magnetic resonance signals, wherein
   said tuning means include means for tuning said second and third coil means slightly offset from accurate tuning points so that voltage phases of the magnetic resonance signals received through said second and third coil means coincide with each other.

* * * * *